(12) United States Patent
Butler et al.

(10) Patent No.: US 6,833,027 B2
(45) Date of Patent: Dec. 21, 2004

(54) METHOD OF MANUFACTURING HIGH VOLTAGE SCHOTTKY DIAMOND DIODES WITH LOW BORON DOPING

(75) Inventors: James E. Butler, Huntingtown, MD (US); Michael W. Geis, Acton, MA (US); Donald D. Flechtner, Watertown, MA (US); Robert L. Wright, Newtown, CT (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 27 days.

(21) Appl. No.: 10/254,809

(22) Filed: Sep. 26, 2002

(65) Prior Publication Data

US 2003/0075100 A1 Apr. 24, 2003

Related U.S. Application Data

(60) Provisional application No. 60/324,509, filed on Sep. 26, 2001.

(51) Int. Cl.⁷ ............................................. C30B 29/04
(52) U.S. Cl. .......................... 117/94; 117/95; 117/105; 117/106; 117/109; 117/929; 423/446
(58) Field of Search ............................ 117/94, 95, 105, 117/106, 109, 929; 423/446

(56) References Cited

U.S. PATENT DOCUMENTS

| | | | |
|---|---|---|---|
| 3,714,334 A | | 1/1973 | Vickery |
| 5,015,494 A | | 5/1991 | Yamazaki |
| 5,081,438 A | * | 1/1992 | Nakahata et al. ....... 338/22 SD |
| 5,250,149 A | | 10/1993 | Kimoto et al. |
| 5,352,908 A | | 10/1994 | Kobashi et al. |
| 5,400,738 A | * | 3/1995 | Shiomi et al. ................ 117/84 |
| 5,474,021 A | | 12/1995 | Tsuno et al. |
| 5,672,382 A | * | 9/1997 | Lux ........................... 427/213 |
| 5,704,976 A | | 1/1998 | Snail |

FOREIGN PATENT DOCUMENTS

EP          1179621       *  2/2002

OTHER PUBLICATIONS

Kalish et al, "Is sulfur a donor in diamond?", Applied Physics Letters, vol. 76 No. 6 pp. 757–759 Feb. 7, 2000.*
Stallup II et al. "Atomic structure of the diamond (100) surface studied using scanning electron microscopy". J. Vac. Science Technology, B 14(2), Mar/Apr 1996.
Lee et al. "CVD diamond films: nucleation and growth". Material Science and Engineering Reports, Propagation 123–154, Jun. 1999.

* cited by examiner

*Primary Examiner*—Robert Kunemund
(74) *Attorney, Agent, or Firm*—John J. Karasek; Joseph T. Grunkemeyer

(57) ABSTRACT

A method of making a Schottky diode comprising the steps of: providing a single crystal diamond comprising a surface; placing the single crystal diamond in a CVD system; heating the diamond to a temperature of at least about 950° C.; providing a gas mixture capable of growing diamond film and comprising a sulfur compound through the CVD system; growing an epitaxial diamond film on the surface of the single crystal diamond; baking the diamond at a temperature of at least about 650° C. in air for a period of time that minimizes oxidation of the diamond; and fabricating a Schottky diode comprising the diamond film. A Schottky diode comprising an epitaxial diamond film and capable of blocking at least about 6 kV in a distance of no more than about 300 μm.

28 Claims, 10 Drawing Sheets

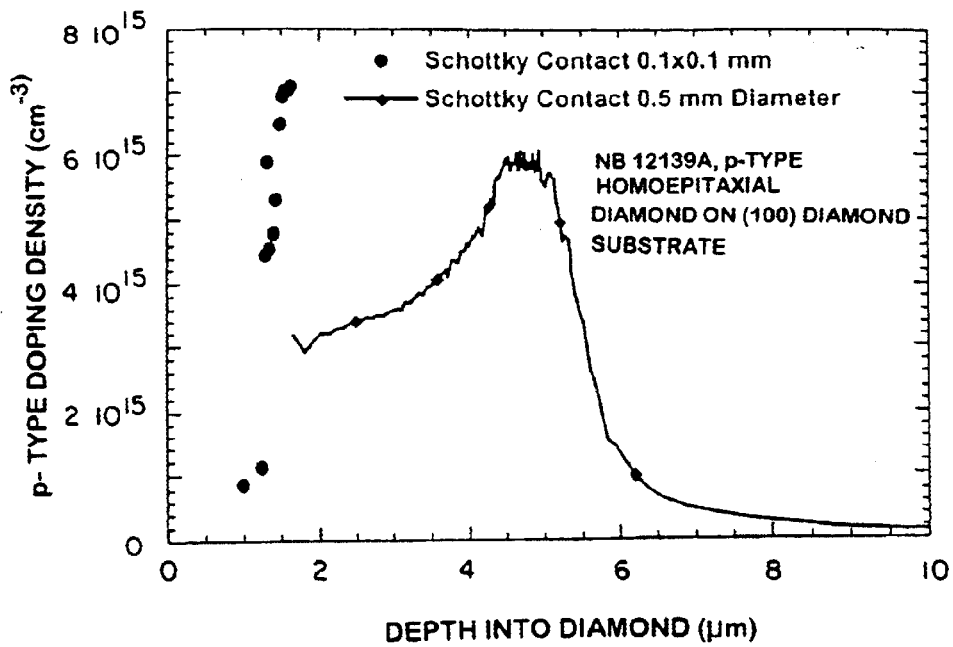
FIG. 12
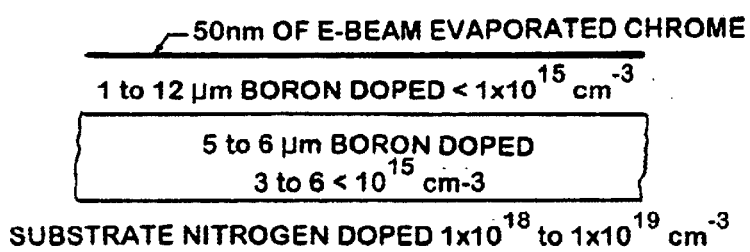
FIG. 13(a)
FIG. 13(b)

METHOD OF MANUFACTURING HIGH VOLTAGE SCHOTTKY DIAMOND DIODES WITH LOW BORON DOPING

CROSS-REFERENCE TO RELATED APPLICATIONS

This application is related to and claims priority from a co-pending Provisional Application Ser. No. 60/324,509, filed on Sep. 26, 2001, the entire contents of which are incorporated herein by reference.

BACKGROUND OF THE INVENTION

1. Field of the Invention

This invention relates to a method of manufacturing electronic devices. More particularly, it relates to a method of manufacturing high voltage Schottky diamond diodes by growing pure epitaxial diamond layers of low boron doping using microwave plasma chemical vapor deposition.

2. Description of the Prior Art

Diamond films grown using chemical-vapor deposition (CVD) have attracted considerable interest due to their large number of technological applications ranging from flat panel displays for computers to electro-optical components. Such films are grown from a mixture of hydrocarbon gas, such as methane, and hydrogen that is broken by a hot-tungsten filament or microwaves to hydrocarbon radicals and atomic hydrogen.

Diamond having a larger band gap (5.5 eV) compared to SiC (3.4 eV), Ga (3.2 eV), and Si (1.1 eV) should enable the fabrication of diodes with larger breakdown voltages than exhibited by diodes formed in other semiconductors. However, diamond diodes and transistors have not exhibited breakdown voltages in excess of 500 V in any known published report, while diodes formed in other semiconductors exhibit significantly higher breakdown. The primary cause for this phenomenon of low breakdown voltage was observed to be the inability to control impurities in the diamond.

Diamond, having the highest atomic density of any terrestrial material, cannot easily incorporate other larger atoms into its crystal. The very few exceptions to this are the small atoms of hydrogen, boron, and nitrogen. Hydrogen is not known to substantially effect the electrical properties of single crystal diamond, but is known to bind with other impurities like boron making them electrically inactive. Boron is a p-type dopant with an activation energy of 0.36 eV, and nitrogen is a deep n-type dopant with an ionization energy of about 1.7 eV. Other impurities such as, for example, phosphorous, lithium, and sulfur are possible n-type dopants, but the results reported so far have been inconsistent.

In forming a diamond film through microwave plasma CVD, a boron-doped (B-doped) p-type diamond film is obtained by doping with boron, i.e., a metallic element of group III. B-doped diamond films are expected to form Schottky diodes having excellent heat and radiation resistance, properties not reported to have been achieved by conventional Schottky diodes produced with Si and GaAs. Other electronic devices having excellent characteristics may be fabricated using diamond films.

Methods which are commonly used to grow thin films of semiconducting diamonds include microwave plasma assisted CVD techniques and a hot filament assisted CVD techniques. In these methods, feed gases such as $CH_4$, CO, and $H_2$ are decomposed using a microwave induced plasma or a hot filament. This results in the formation of thin diamond films on a heated substrate made of Si, Mo, diamond, etc. Addition of $B_2H_6$ to the feed gases allows thin films of p-type diamond to be obtained.

FIG. 1 shows a prior art Schottky diode formed by depositing a heavily B-doped p-type polycrystalline diamond film on a p-type Si substrate b (the diamond film was prepared using diborane ($B_2H_6$) and a 5% CO gas diluted by $H_2$). An In electrode c, which has an ohmic characteristic, is placed on the back side of the Si substrate. An Al needle electrode is placed on the lightly B-dope p-type polycrystalline diamond film a. This point contact electrode has Schottky characteristics. As shown in FIG. 2, this Schottky diode prevents a flow of electric current between electrodes c and d when a positive voltage is applied to the Al needle electrode d relative to the In electrode c, whereas it permits a flow of electric current, when a negative voltage is applied to the Al needle electrode.

A study of a Schottky diode similar to that shown in FIG. 3 has been reported in Hicks et al., "The barrier height of Schottky diodes with a chemical-vapor-deposited diamond base," *J. Appl. Phys.*, 65(5), 2139–2141 (1989). This Schottky diode is formed by depositing a polycrystalline diamond film on a p-type (100) Si substrate b' having a resistivity in the range of 0.01 to 0.1 ohm-cm (the diamond film was prepared by microwave plasma CVD process using $CH_4$ diluted by $H_2$ as a source gas). An ohmic contact electrode c' is attached on the backside of the substrate, and an Au electrode d' of a diameter of 0.1 cm and a thickness in the range of 140 to 500 Angstroms is deposited on the polycrystalline diamond film a'. The corresponding I-V characteristics are shown in FIG. 4.

In order to fabricate devices which use semiconducting diamonds, it is necessary to provide thin films of high-crystalline quality with few dislocations and point defects. Conventionally, these films are formed by heating the substrate to a suitable temperature under a suitable degree of vacuum and introducing the feed gases immediately to grow a thin film.

FIG. 5 illustrates a conventional process of forming thin diamond films. X-axis plots time and Y-axis plots temperature. Two successive steps are differentiated by a vertical line. The gases to be introduced are indicated in the space defined by the temperature line and the partition lines. After a suitable vacuum is drawn, $H_2$ gas is introduced into the vacuum chamber and the temperature is raised. When the substrate has been heated to an appropriate growth temperature, feed gases, such as, for example, $CH_4$, $H_2$, and optionally $B_2H_6$, are introduced. $B_2H_6$ is added to the reaction when a p-type crystal is to be formed. The introduced gases are excited by microwaves, heat, a high-frequency plasma, and other excitation methods, thus causing the feed gas to enter into a vapor phase reaction to form a thin film of diamond on the substrate.

However, thin films obtained by the use of conventional methods of vapor-phase synthesis contain a large number of defects and impurities. Unintentionally doped p-type films generally result from residual boron contamination in the reactor, or contain high concentrations of electronic trap states within the bandgap of diamond from impurity incorporation, usually due to nitrogen. The low quality of such films makes it impossible to fabricate devices that make use of the inherently good physical properties of diamond. This may be due to the fact that the impurities or defects remain on the surface of the diamond substrate.

SUMMARY OF THE INVENTION

Exceptionally pure epitaxial diamond layers have been grown by microwave plasma chemical vapor deposition having low boron doping, from $5 \times 10^{14}$ to $1 \times 10^{16}$ cm$^{-3}$. The compensating n-type impurities are the lowest ($<3 \times 10^{13}$ cm$^{-3}$) reported for any semiconductor diamond. The hydrogen impurities that bind with the boron making them electrically inactive appear to have been reduced by baking the diamond to >700° C. for ~1 s in air. Schottky diodes made on these epitaxial diamond films have breakdown voltages >6 kV, which is about 12 times the highest known, reported breakdown voltage for any diamond diode and higher than the breakdown voltage than any other known, reported semiconductor Schottky diode of similar thickness.

The invention comprises a method of making a Schottky diode comprising the steps of: providing a single crystal diamond comprising a surface; placing the single crystal diamond in a CVD system; heating the diamond to a temperature of at least about 950° C.; providing a gas mixture capable of growing diamond film and comprising a sulfur compound through the CVD system; growing an epitaxial diamond film on the surface of the single crystal diamond; baking the diamond at a temperature of at least about 650° C. in air for a period of time that minimizes oxidation of the diamond; and fabricating a Schottky diode comprising the diamond film.

The invention further comprises a Schottky diode comprising an epitaxial diamond film and capable of blocking at least about 6 kV in a distance of no more than about 300 μm.

While the invention has been herein shown and described in what is presently conceived to be the most practical and preferred embodiment, it will be apparent to those of ordinary skill in the art that many modifications may be made thereof within the scope of the invention, which scope is to be accorded the broadest interpretation of the appended claims so as to encompass all equivalent methods and apparatus.

BRIEF DESCRIPTION OF THE DRAWINGS

FIG. 12 shows the doping variation through the thickness of the homoepitaxial layer, as determined by C-V measurements on the diode as shown in FIG. 13;

FIG. 13($a$) shows doping through the thickness of sample NB12139A p-type homoepitaxial diamond on a (100) diamond substrate in an example embodiment of the present invention;

FIG. 13($b$) shows depletion of the semiconductor during reverse bias of 6.5 kV of the sample shown in FIG. 13($a$);

DETAILED DESCRIPTION OF THE PREFERRED EMBODIMENTS

Figure 1:
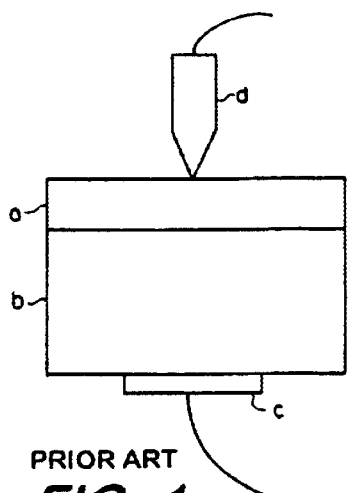
FIG. 1 is a cross sectional view of a conventional Schottky diode.
Figure 2:
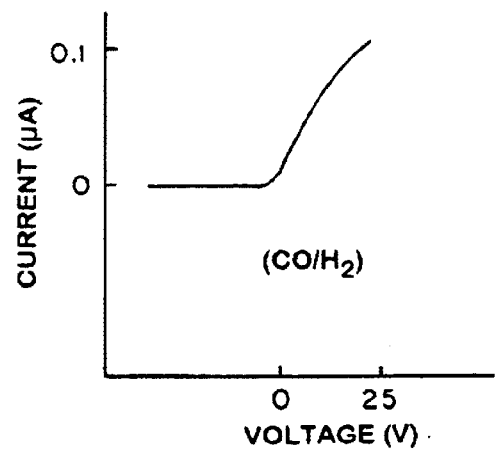
FIG. 2 is a graph showing the I-V characteristic of the Schottky diode of FIG. 1.
Figure 3:
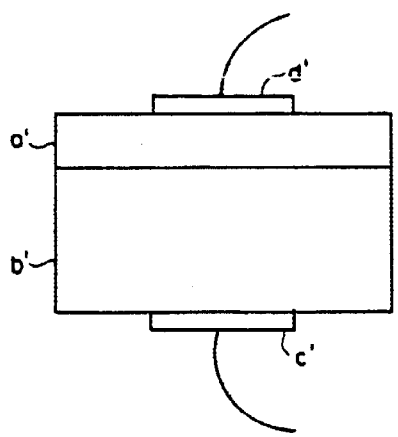
FIG. 3 is a cross sectional view of another conventional Schottky diode.
Figure 4:
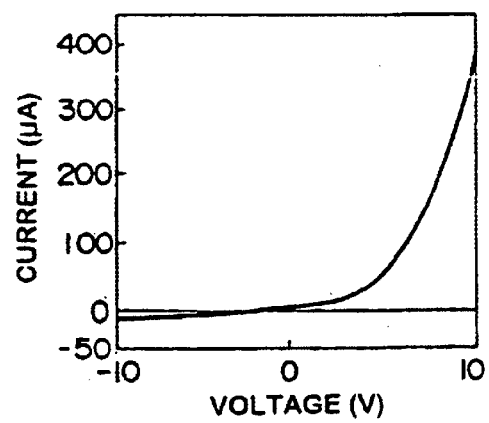
FIG. 4 is a graph showing the I-V characteristic of the Schottky diode of FIG. 3.
Figure 5:
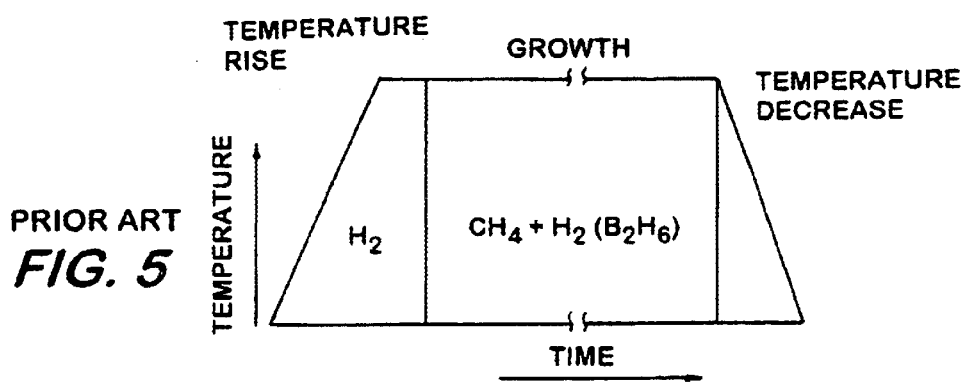
FIG. 5 shows a diagram of a conventional process for forming a thin diamond film.
Figure 6:
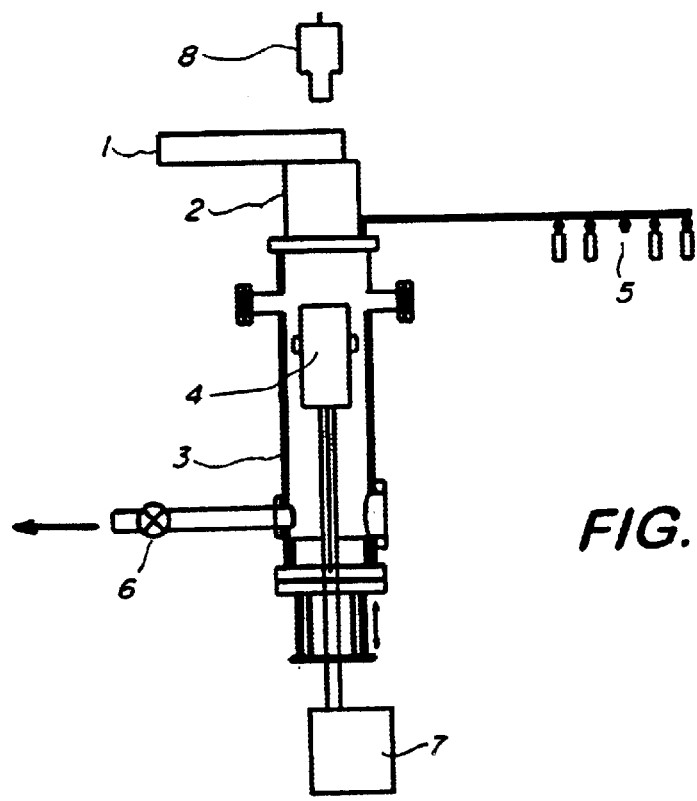
FIG. 6 is a schematic view of a vapor-phase diamond synthesizing apparatus for carrying out a Schottky diode manufacturing process in an example embodiment of the present invention.

A Schottky diode manufacturing process in accordance with the present invention is carried out, by way of example, by a microwave plasma CVD apparatus schematically illustrated in FIG. 6. In this apparatus, the microwaves generated by a microwave power source 1 are transferred through a waveguide 2 into a reaction chamber 3 made from stainless steel through a fused silica window. The diamond is placed within the reaction chamber 3 on a sample stage 4. A gaseous mixture is introduced into the reaction chamber 3 through a gas feed manifold 5. Gases are removed by a vacuum pump 6. The sample stage 4 is heated with a rf induction heater 7 and the temperature is measured with a pyrometer 8. Microwaves are applied to the gaseous mixture in order to generate a plasma above the sample stage 4, whereby a diamond film is formed on the diamond. Means other than microwaves are also suitable and are known in the art.

The gas mixture comprises gases that are capable of growing an epitaxial diamond film. Such gases are known in the art. A mixture of $H_2$ and $CH_4$ is a suitable mixture. The mixture also comprises a sulfur compound such as $H_2S$. It is presumed that the role of the sulfur compound in the gas mixture is to react with and suppress the incorporation of residual boron impurities in the grown diamond film, and to possibly improve the quality of the diamond in a manner similar to the effects of adding oxygen compounds to the gas reactants. It is believed that the sulfur compound acts as a getter for boron by reacting with boron compounds that may be present in the CVD system. Such boron compounds are usually present as contaminants, either from previous use of the CVD system with boron or from the manufacturing of the CVD system. When the diamond is heated at least about 950° C. or at least about 1070° C., it is believed that the sulfur-boron product does not adhere to the diamond so as to be incorporated into the epitaxial diamond film. Thus the concentration of boron in the film is reduced.

The advantage of reducing the boron concentration is that it improves the blocking voltage. However, some activated boron must be present or else the film would not function in a Schottky diode. The boron may be inactivated by bonding with hydrogen. This hydrogen may be removed, activating the boron acceptor states in the near surface region, by baking the film in air at least about 650° C. or at least about 700° C. The baking time should be short enough to minimize oxidation of the film. One second is a suitable baking time. The baking can be done outside of the CVD system. These are proposed mechanisms. The scope of the claims is not limited to these mechanisms.

The combination of lowering the boron doping and increasing the boron activation can result in a Schottky diode material having a very high blocking voltage. The blocking voltage may be at least about 6 kV over a distance of no more than 300 $\mu$m, or even 10 $\mu$m. The thickness of the film may be only about 7 $\mu$m.

The method may produce a boron doping level that is lower than a desired level, although the desired level may not be obtainable by prior methods. The boron concentration in the film can be increased by adding a boron compound, such as $B_2H_6$ to the gas mixture. This may, however, reduce the blocking voltage. Balancing between the doping level and the blocking voltage may be necessary.

EXAMPLES

Epitaxial Diamond Growth

Type Ib, high pressure high temperature grown synthetic, single-crystal diamonds (from Sumitomo Electric) were polished with a major face slightly off the (100) axis and were used as substrates to grow epitaxial diamond. A modified commercial (Astex) 1.5 kW microwave plasma chemical vapor deposition system, as shown in FIG. 6, was used for growth of epitaxial diamond with a gas flow of 200 sccm of $H_2$, 2 sccm of $CH_4$ and 0.01510 sccm of $H_2S$ at 80 Torr. The substrate was inductively heated with between 0 and 3500 Watts of rf power and held at a constant temperature of 1070° C., as measured by a small spot single color pyrometer, in order to achieve a growth rate of 0.4 to 1 $\mu$m/hr. The growth system of the present invention may minimize trace amounts of nitrogen and silicon which might get incorporated into the diamond. The addition of $H_2S$ may have an impact on improving the quality, similar to oxygen additions, and minimizing the incorporation of boron. The incorporation of boron was from residual boron present in the growth system from previous boron doped runs using $B_2H_6$ as a boron source. The resulting diamond films incorporated primarily boron and hydrogen as impurities.

Characterization of Epitaxial Diamond

Figure 7:
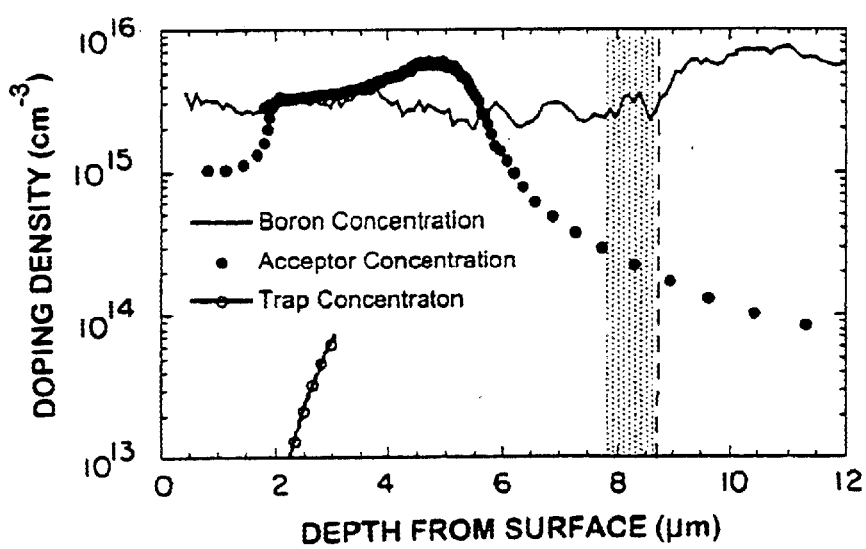
FIG. 7 shows impurity concentrations determined by secondary ion mass spectroscopy (SIMS) and capacitance-voltage (C-V) characterization of Schottky diodes.

The impurity concentration in the diamond was characterized by both secondary ion mass spectroscopy (SIMS) and by capacitance-voltage (C-V) measurement of Schottky diodes formed on the epitaxial layer. FIG. 7 shows a summary of the boron, p-type dopant and donor trap concentrations. SIMS determined the boron concentration with a detection limit of $2\times10^{15}$ cm$^{-3}$ while the acceptor and trap concentrations were determined by C-V Schottky diode measurements. The epitaxial film-substrate interface and the film thickness were determined by the sudden increase of nitrogen from $<2\times10^{16}$ cm$^{-3}$ to $>10^{18}$ in the Ib type diamond substrate, as determined by SIMS.

It was observed that SIMS measurements of Fe, O, S and Si, impurities were approximately equal to the detection limits, which are $4\times10^{14}$, $7\times10^{16}$, $1\times10^{15}$, and $5\times10^{16}$ cm$^{-3}$, respectively, and did not change at the film-substrate interface. It was also observed that only Cr exhibited a substantial concentration, $1\times10^{14}$ cm$^{-3}$ well above the detectable concentration of $\sim1\times10^{13}$ cm$^{-3}$. The hole trap density was determined by measuring the change of Schottky diode capacitance as a function of time. This technique is most sensitive to traps with room temperature lifetimes between 1 s and 2 min, which is consistent with the detrapping time of holes from substitutional nitrogen impurities.

Figure 8:
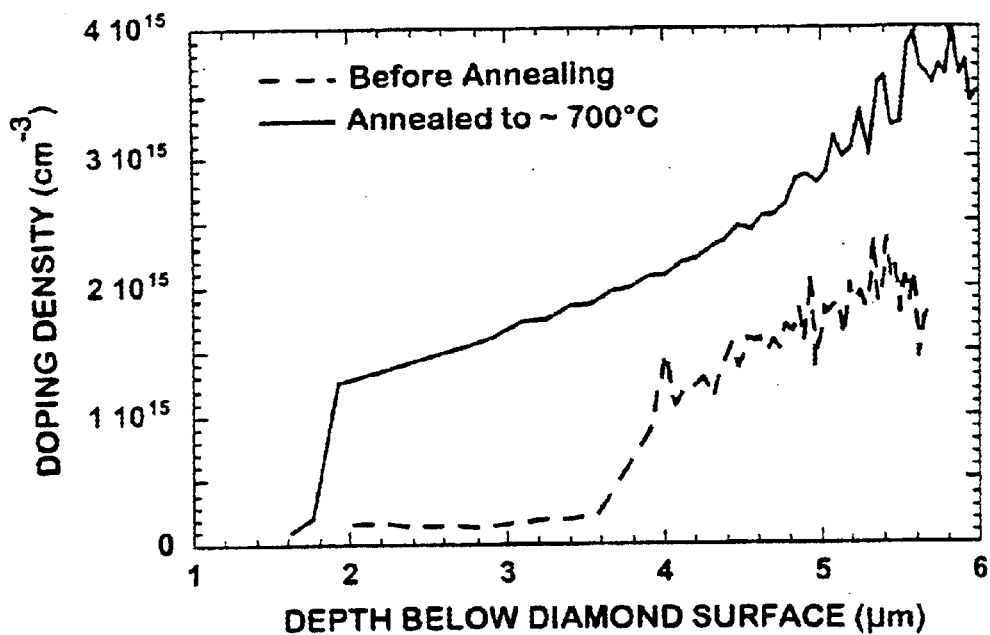
FIG. 8 shows a concentration of p-type impurity as a function of depth from the diamond surface in an example embodiment of the present invention.

The other impurity, hydrogen, was found to be more difficult to determine by SIMS, but its presence is indicated by the lower p-type dopant concentration, determined by C-V measurements, than the boron impurity concentration. Hydrogen is believed to chemically bind to the boron atoms removing boron's electrical activity. FIG. 7 shows this effect, where the first 1.5 $\mu$m of the epitaxial film has a p-type dopant concentration, which is considerably smaller than the boron concentration. The vertical dashed line represents the position of the epitaxial film-substrate interface and the shaded region to its left represents the depletion width in the epitaxial film. Most of the hydrogen was removed by heating the diamond to ~700° C. for one second (1 s) in air, as shown in FIG. 8. Before annealing, the first 3.5 $\mu$m of the epitaxial layer is electrically inactive. After annealing the inactive layer is reduced to ~1.5 $\mu$m and the overall acceptor concentration was observed to have increased. It was observed that annealing the diamond on a strip heater for 1 s at about 700° C. in air eliminates more than half of the hydrogen bound to the boron, hereby increasing p-type impurity concentration.

Electrical Characterization

Figure 9:
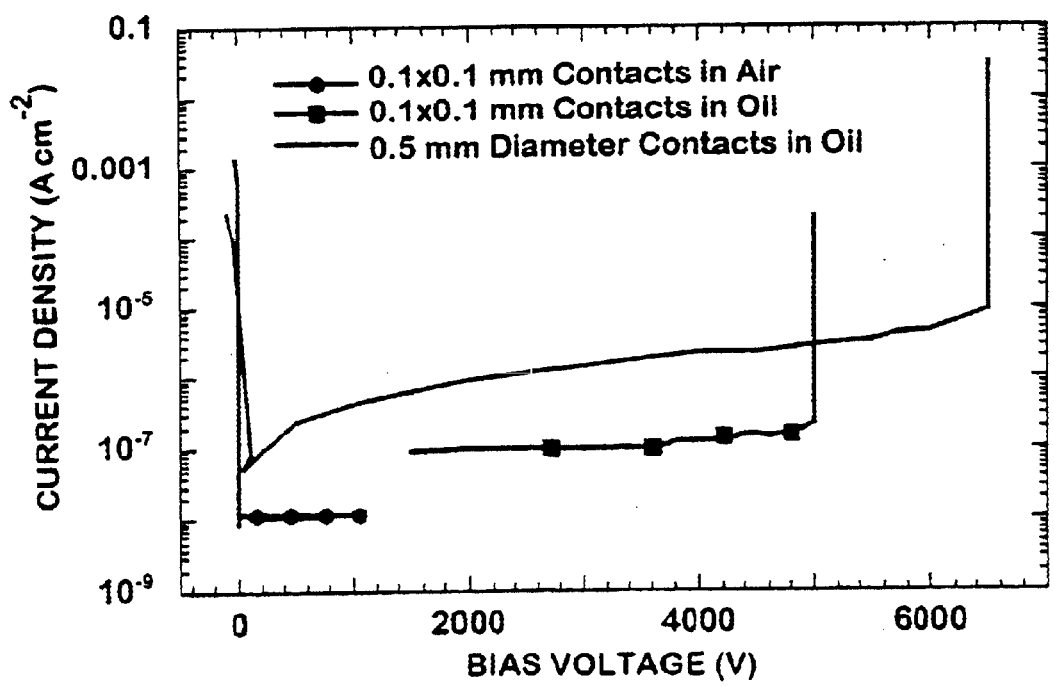
FIG. 9 shows current-voltage curves for Schottky diodes on the epitaxial diamond films in an example embodiment of the present invention.

The breakdown voltage of Schottky diodes depends upon the acceptor doping level. With low boron and acceptor concentrations (i.e., $<10^{16}$ cm$^{-3}$), exceptionally high breakdown voltage Schottky diodes were obtained. The diodes were fabricated with 50 nm of electron-beam evaporated chrome Schottky and ohmic contacts. The diamond was heated to about 150° C. during evaporation to enhance adhesion and the chrome was patterned using wet chemical etching and standard lithography. Although the epitaxial film contained many hillocks, the leakage of square 0.1×0.1 mm diodes appeared to be unaffected by these crystal defects and remained $<10^{-11}$ Amperes to a voltage up to 1100 V. Above 3 kV the diodes failed by arcing over the surface. This failure mode was minimized by probing the diodes in oil. FIG. 9 shows the breakdown voltage for diodes formed by 0.1×0.1 mm and 0.5 mm in diameter chrome pads in oil. Even with the oil, the diode sustained only surface damage. When the metal was removed and the diamond was cleaned in molten $NaNO_3$, newly fabricated diodes still held off 1100 V with low leakage. Leakage current measurements at 1000 V from 100 to 325° C., indicated the Schottky barrier height to be 1.05 eV. The reverse leakage for the diodes tested in air to 1100 V was about $10^{-12}$ A, the minimal detectable current of the electrometer. The higher leakage currents for the diodes tested in oil is the result of current flowing through the oil.

Although diamond Schottky diodes have previously been shown to have the highest voltage breakdown of any published Schottky diodes, the diodes had large forward resistances, 300 Ω cm$^{-2}$. This large resistance is the result of poor ohmic contacts, non-optimum device geometry, and hydrogen electrically-compensated boron impurities. Under optimum conditions the calculated forward resistance using uncompensated boron doped diamond is between 0.01 and 0.1 Ω cm$^{-2}$ for diodes with a breakdown voltage of 10 kV. It was observed that similar diodes formed in Si would have a resistance of 30 Ω cm$^{-2}$.

Figure 10:
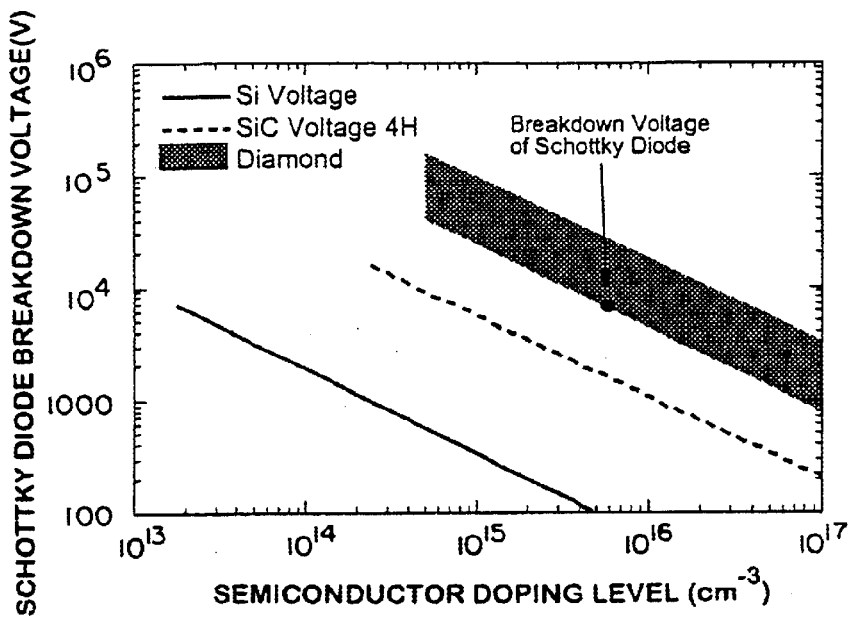
FIG. 10 shows a comparison of maximum breakdown voltage of Schottky diodes formed on Si, SiC, and diamond.

The breakdown voltage of a diode depends upon the fundamental properties of the semiconductor and the technically-limited minimal controllable doping density. FIG. 10 compares the breakdown voltage of diamond, SiC, and Si as a function of doping density. The voltage breakdown for diamond was obtained from Eq. (1), which empirically predicts the breakdown voltage of Si and other semiconductors.

$$V_{max} = k/N^{3/4} \qquad \text{Equation (1)}$$

Where $V_{MAX}$ is the break down voltage of the diode, N is the doping density in cm$^{-3}$ and k is a constant experimentally determined. From Landstrass measurements (see Landstrass et al., "Device Properties of homoepitaxial grown diamond," *Diam. Relat. Mater.*, 2, 1033–7) at higher doping levels, k=1.9×10$^{16}$ V cm$^{-9/4}$. The width of the diamond (shaded region) in FIG. 10 terminated on the top by Landstrass data and the lower limit is ⅓ of that value. The upper limit of the shaded region for diamond was obtained from Landstrass and the lower region assumes that the breakdown electric field for diamond is one third of that assumed by Landstrass. The lines terminate where the minimal uniform doping density was obtained. The position of the reported Schottky diode is shown in FIG. 10 by a ".". Note that the breakdown voltage of the Schottky diode is higher than SiC and Si at this doping level.

The present invention results in low levels of the impurities of boron, nitrogen, and hydrogen in epitaxial diamond films. This resulted in ~12 times increase in the breakdown voltage of Schottky diodes made on the epitaxial films, which is the highest breakdown voltage for any Schottky diode known to the inventors.

Breakdown Voltage

Figure 11:
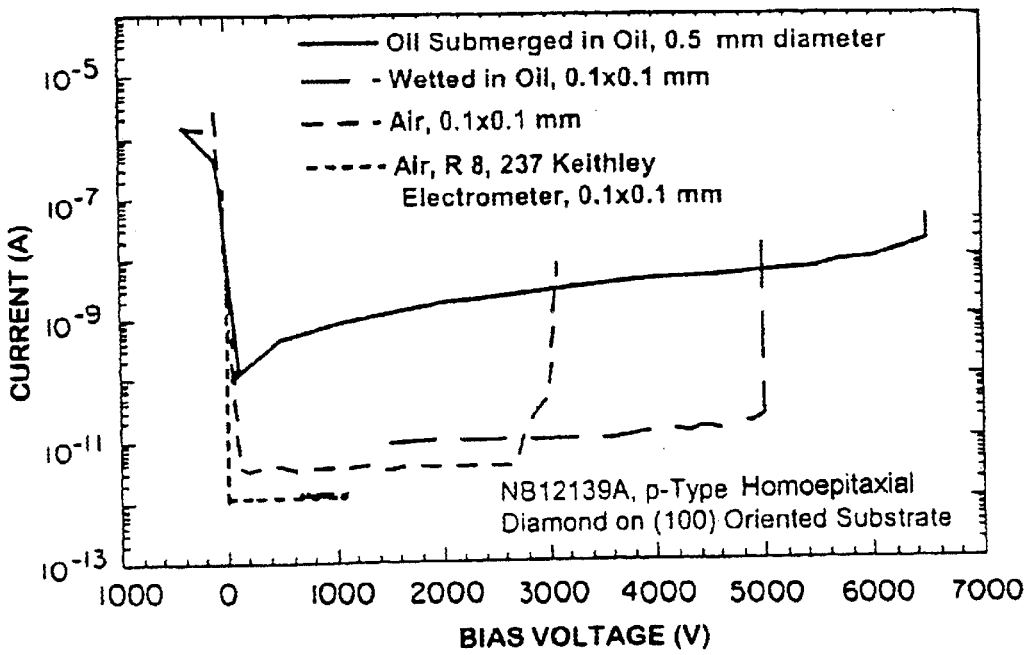
FIG. 11 is a graph illustrating room temperature leakage current as a function of bias voltage under different conditions for Schottky diodes on lightly doped diamond as shown in FIG. 13.

FIG. 11 is a graph showing room temperature leakage current as a function of bias voltage under different conditions. The breakdown voltage of Schottky diodes on lightly doped diamond was limited by surface breakdown. FIG. 11 specifically shows that the breakdown voltage of the diode increased from testing in air, to wetted by 705 diffusion pump oil, to the whole diode submerged in oil. The reverse leakage current increased with the addition of oil due to the small but finite oil conductivity. Breakdown voltages were 2.6 kV in air, 5 kV for the diode coated in oil, and 6 kV sustained, 6.5 kV transient when the diode is submerged in oil. Previously reported breakdown voltages of Schottky diodes on SiC diodes were <2 kV and SiC PIN diodes have the highest reported breakdown voltage of 5.5 kV.

FIG. 12 shows the doping variation through the thickness of the homoepitaxial layer, as determined by C-V measurements on the diodes. Using the measurements, the depletion width along with the surface of the diamond was calculated to be about 28 μm as shown in FIG. 13. FIG. 12 specifically illustrates doping density as a function of depth into the diamond. The black dots were obtained using 0.1×0.1 mm Schottky diodes and the curve was obtained with a 0.5 mm diameter diode on different areas of the same 4×4 mm diamond sample.

Figure 14:
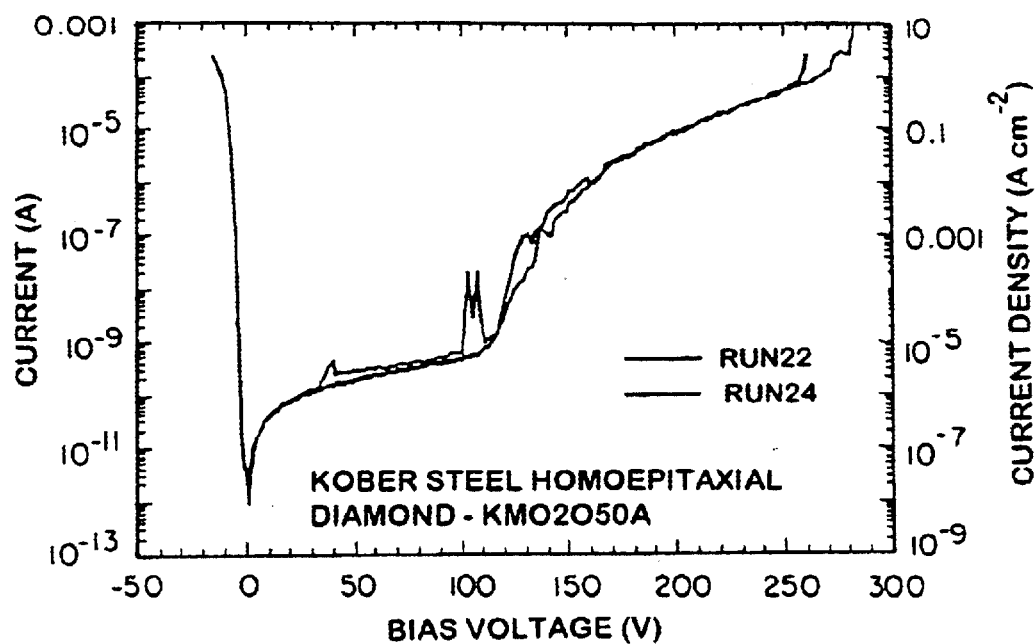
FIG. 14 shows current-voltage curves for 0.1×0.1-mm Schottky diode of another exemplary diamond sample as in FIG. 17.
Figure 15:
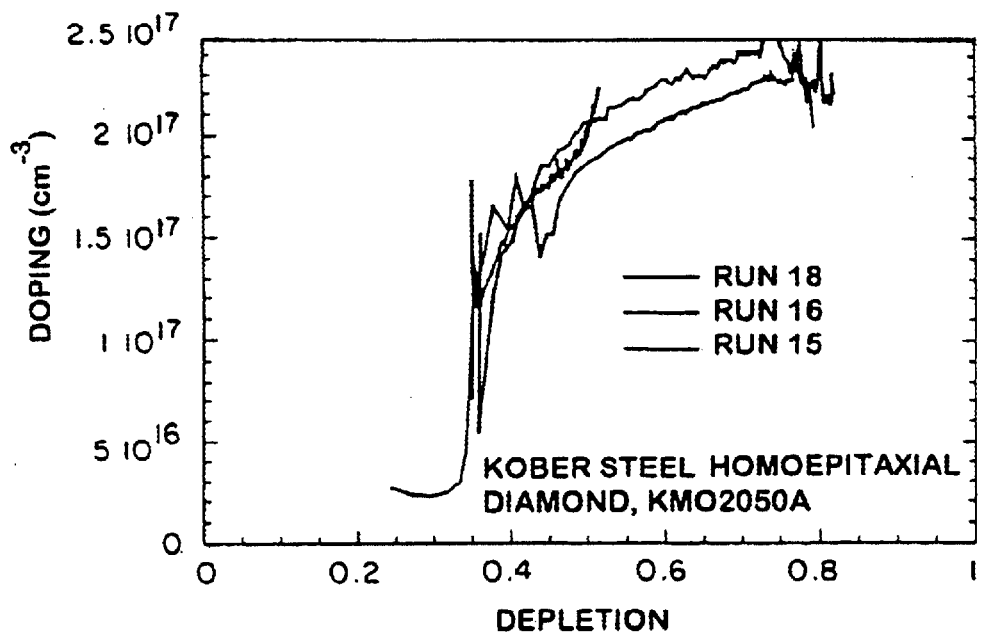
FIG. 15 shows doping as a function of depth into the diamond of the sample as identified in FIG. 17.
Figure 16:
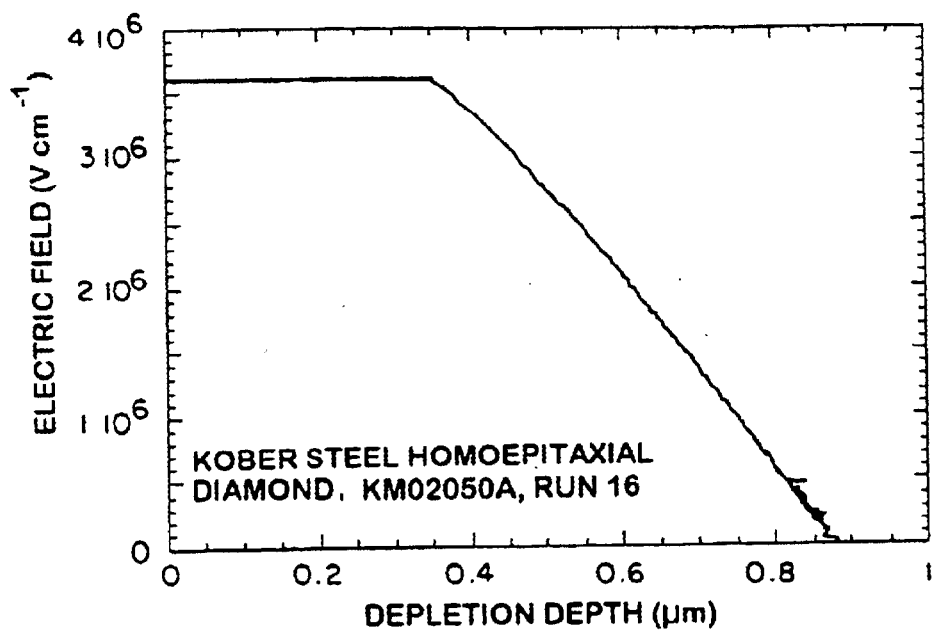
FIG. 16 shows electric field in the semiconductor of the sample identified in FIG. 17.

A second diamond obtained from Kobe Steel was also characterized. FIG. 14 shows the current-voltage curve obtained for a 0.1×1.0 mm square Schottky diode. The first curve R22 was biased until a sudden increase in current occurred at ~250 V. No damage was observed during this sudden increase in current, since the next test R24 showed a similar I-V breakdown at ~280 V. Addition of oil made no measurable difference in the I-V curves. The capacitance of these diodes as a function of bias voltage was used to calculate both the doping density and the electric field distribution through the semiconductor, as shown in FIGS. 15 and 16. FIG. 16 shows the electric field in the semiconductor when biased to 225V. It was observed that diode breakdown occurred at 280 V.

Figure 17:
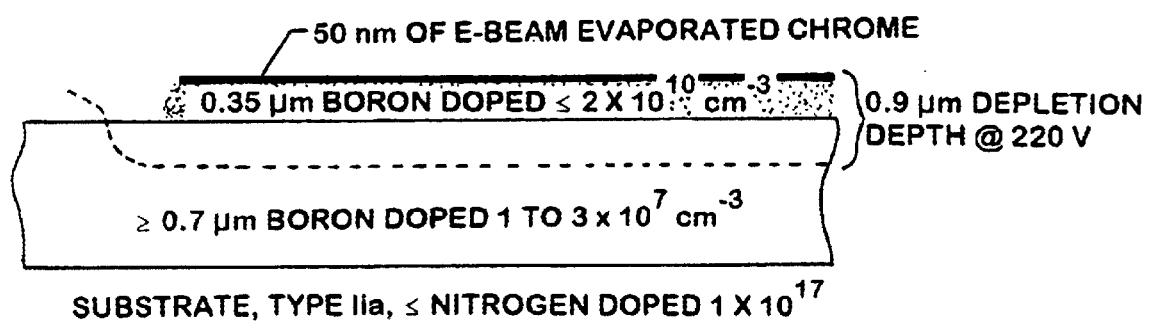
FIG. 17 shows doping profile of another exemplary diamond sample (Kobe Steel diamond, KG02050A), and a position of depletion region when Schottky diode is biased to 220 V in another exemplary embodiment of the present invention.

FIG. 17 is a cross-section through the epitaxial layer showing the position of the depletion region. Specifically, FIG. 17 shows a doping profile of Kobe Steel diamond sample, and the position of the depletion region when Schottky diode is biased to 220 V.

Temperature Effect on NB12139A

Figure 18:
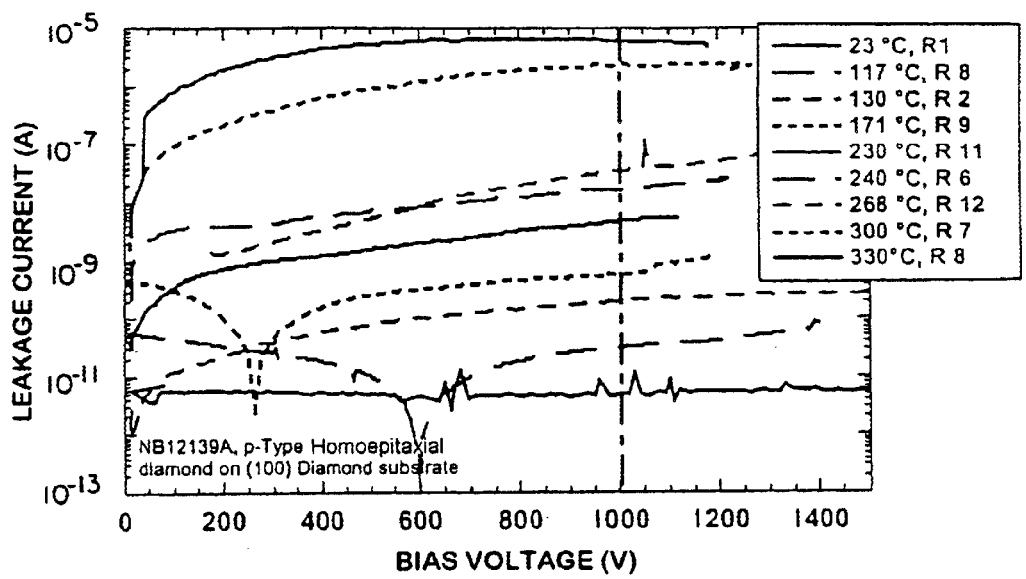
FIG. 18 shows leakage current as a function of bias voltage for several temperatures for the sample as in FIG. 13($a$)

The leakage current increase and the breakdown voltage decrease are two factors that limit the maximum operating temperature of semiconductor diodes. FIG. 18 shows the leakage current for several temperatures on sample NB12139A with 0.5 mm diameter chrome Schottky diode.

Figure 19:
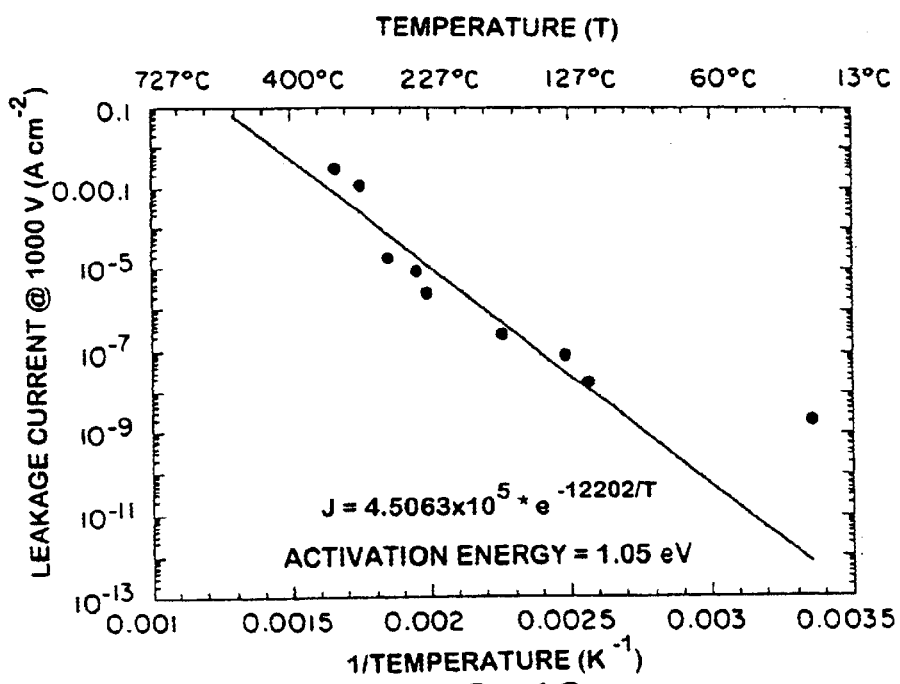
FIG. 19 shows a graph of leakage current at 1000 V, shown in FIG. 18, as a function of the reciprocal of temperature.

From the leakage current measurements at 1000 V, a plot of leakage current as a function of the reciprocal of temperature gives an activation energy of 1.05 eV, as shown in FIG. 19. This activation energy is often interpreted as the barrier height for carriers, in this case electrons, to become thermally excited over an electron barrier at the metal-diamond interface.

Figure 20:
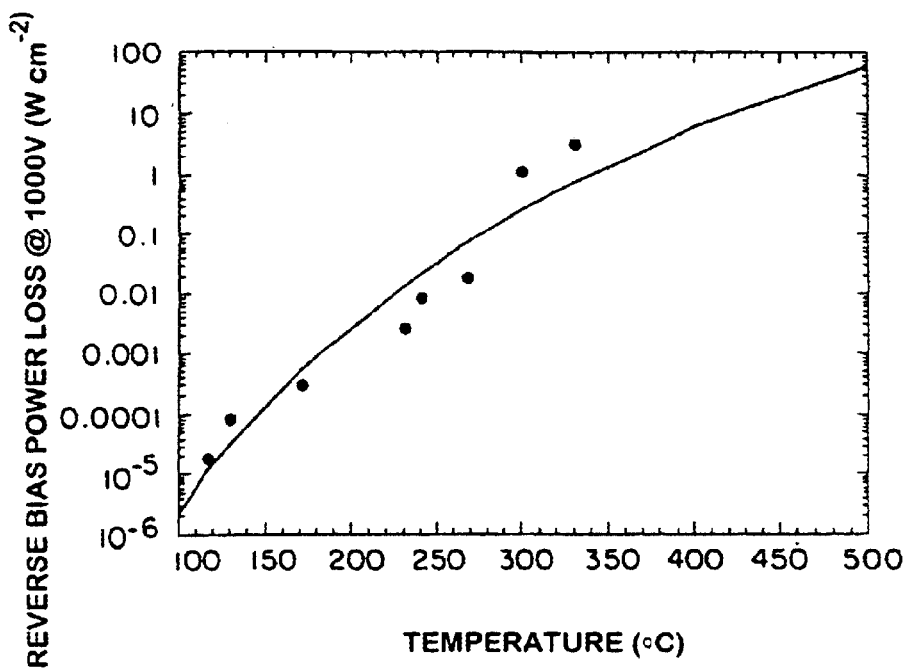
FIG. 20 shows power dissipation in Schottky diode reversed biased to 1000 V as a function of temperature, for the sample shown in FIG. 13($a$)

FIG. 20 shows the heat generated from leakage current when the device is reverse biased to 1000 V. At 330° C. the current was linear with voltage to 1000 V. If this trend continuous, then the power dissipation would be 250 W cm$^{-2}$ at 5 kV reverse bias. It should be compared to the forward power dissipation, which at 100 A cm$^{-2}$ would result in 500 to 1000 W cm$^{-2}$.

Figure 21:
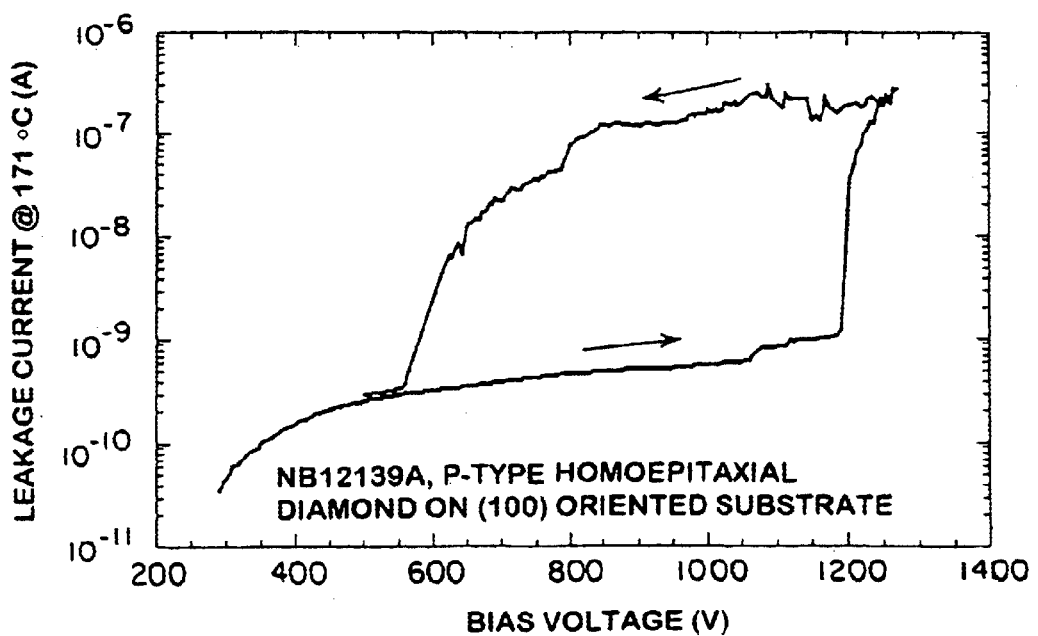
FIG. 21 shows typical I-V curve obtained from a 0.5-mm diameter Schottky diode at 171° C. for the sample shown in FIG. 13($a$)

Between 171 and 268° C. the leakage current exhibited hysteresis. FIG. 21 shows this hysteresis, as the reverse bias voltage is swept to 1200 V and back to zero volts. It was observed that this phenomenon was due to the substrate being nitrogen doped probably to 10$^{18}$ cm$^{-3}$, nearly 1000 times the doping level in the epitaxial layer. When the n-type nitrogen doped diamond substrate is replaced with either a p-type or undoped diamond this increase in leakage current will not occur.

Figure 22:
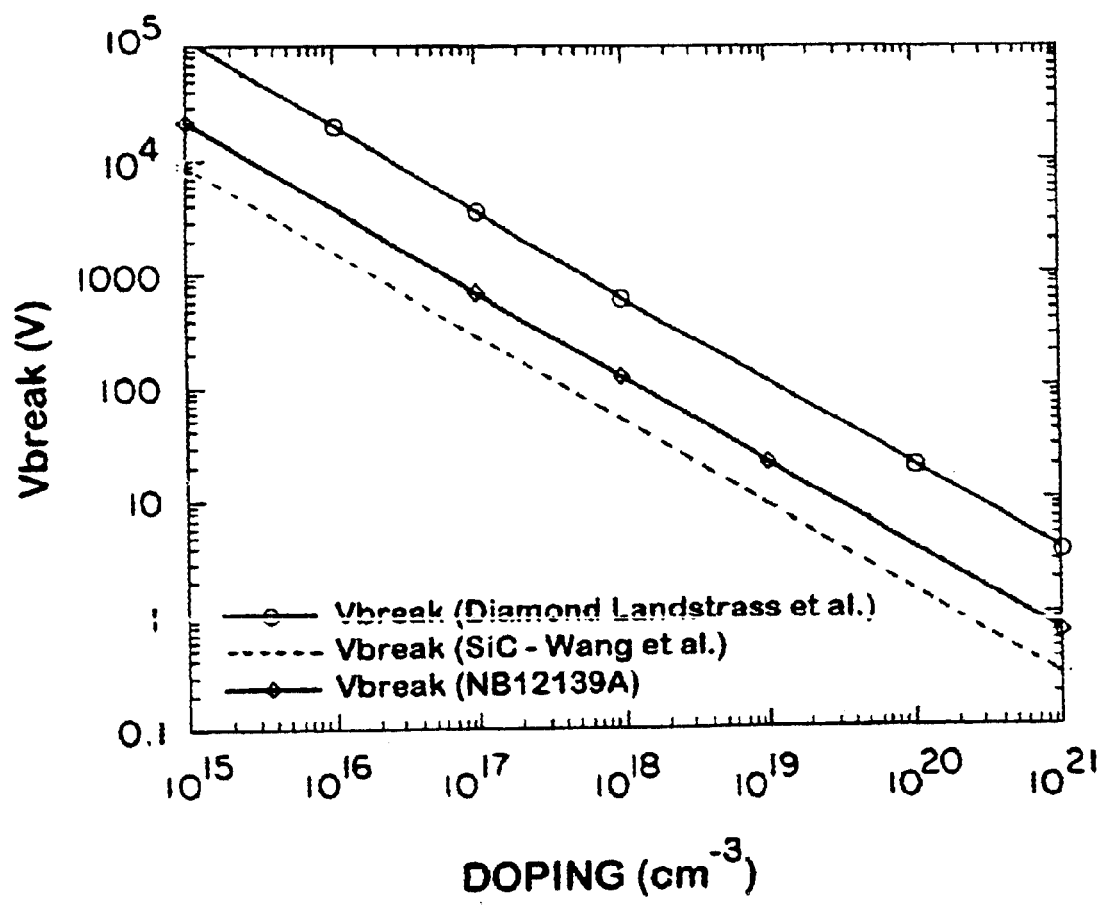
FIG. 22 is a graph illustrating a comparison of breakdown voltage as a function of doping for SiC and diamond sample shown in FIG. 13($a$).

One of the major advantages of diamond over other semiconductors is its high breakdown field. FIG. 22 compares the breakdown voltage of diamond and SiC determined by the inventors. The breakdown voltage as a function of doping determined from data obtained on sample NB 12139A represents a lower limit on the actually obtainable voltage because the electric field enhancement at the edge of the Schottky diode was not included in the calculations.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a Schottky diode comprising the steps of:
   providing a single crystal diamond comprising a surface;
   placing the single crystal diamond in a CVD system;
   heating the diamond to a temperature of at least about 950° C.;

providing a gas mixture capable of growing diamond film and comprising a sulfur compound through the CVD system;

growing an epitaxial diamond film on the surface of the single crystal diamond;

baking the diamond at a temperature of at least about 650° C. in air for a period of time that minimizes oxidation of the epitaxial diamond film; and fabricating a Schottky diode comprising the diamond film.

2. The method of claim 1, additionally comprising the step of:

polishing the surface of the single crystal diamond.

3. The method of claim 2, wherein the polishing step produces a major face of the diamond slightly off the <100> axis of the diamond.

4. The method of claim 1, wherein the diamond is heated to about 1070° C. in the heating step.

5. The method of claim 1, wherein the gas mixture comprises $H_2$ and $CH_4$.

6. The method of claim 1, wherein the gas mixture comprises $H_2S$.

7. The method of claim 1, wherein the gas mixture comprises a boron compound in a concentration sufficient to produce a desired boron doping concentration in the epitaxial diamond film.

8. The method of claim 1, wherein the gas mixture comprises $B_2H_6$.

9. The method of claim 1, wherein the growing step comprises flowing 200 sccm of $H_2$, 2 sccm of $CH_4$, and 0.01510 sccm of $H_2S$ at a pressure of 80 Torr.

10. The method of claim 1, wherein the growing step comprises activating the gases by exciting a microwave plasma in the CVD system.

11. The method of claim 1, wherein the growing step is performed so that the concentration of compensating traps in the epitaxial diamond film is no more than about $10^{13}/cm^3$.

12. The method of claim 1, wherein the growing step is performed so that the concentration of nitrogen in the epitaxial diamond film is no more than about $10^{13}/cm^3$.

13. The method of claim 1, wherein the epitaxial film growth rate is about 0.1 to about 20.0 $\mu m/hr$ 14. The method of claim 1, wherein the epitaxial film growth rate is about 0.4 to about 1.0 $\mu m/hr$.

15. The method of claim 1, wherein the baking step comprises baking the diamond at a temperature of at least about 700° C.

16. The method of claim 1, wherein the baking step comprises baking the diamond for about 1 second.

17. The method of claim 1, wherein the Schottky diode can block at least about 6 kV in a distance of no more than about 300 $\mu m$.

18. The method of claim 1, wherein the Schottky diode can block at least about 6 kV in a distance of no more than about 10 $\mu m$.

19. The method of claim 1, wherein the boron concentration in the epitaxial diamond film is no more than about $10^{16}/cm^3$.

20. The method of claim 1, wherein the boron concentration in the epitaxial diamond film is no more than about $5 \times 10^{14}/cm^3$.

21. A Schottky diode comprising an epitaxial diamond film and capable of blocking at least about 6 kV in a distance of no more than about 300 $\mu m$.

22. The Schottky diode of claim 21, wherein the diode is capable of blocking at least about 6 kV in a distance of no more than about 10 $\mu m$.

23. The Schottky diode of claim 21, wherein the boron concentration in the epitaxial diamond film is no more than about $10^{16}/cm^3$.

24. The Schottky diode of claim 21, wherein the boron concentration in the epitaxial diamond film is no more than about $5 \times 10^{14}/cm^3$.

25. The Schottky diode of claim 21, wherein the epitaxial diamond film is no more than about 7 $\mu m$ thick.

26. The Schottky diode of claim 21, further comprising a chrome Schottky contact.

27. The Schottky diode of claim 21, further comprising a chrome ohmic contact.

28. The Schottky diode of claim 21, wherein the diode is made by a method comprising the steps of:

providing a single crystal diamond comprising a surface;

placing the single crystal diamond in a CVD system;

heating the diamond to a temperature of at least about 950° C.;

providing a gas mixture capable of growing diamond film and comprising a sulfur compound through the CVD system;

growing an epitaxial diamond film on the surface of the single crystal diamond;

baking the diamond at a temperature of at least about 650° C. in air for a period of time that minimizes oxidation of the diamond; and fabricating a Schottky diode comprising the diamond film.

* * * * *